(12) United States Patent
Kaynak et al.

(10) Patent No.: US 11,711,095 B2
(45) Date of Patent: *Jul. 25, 2023

(54) BIT FLIPPING LOW-DENSITY PARITY-CHECK DECODERS WITH LOW ERROR FLOOR

(71) Applicant: Micron Technology, Inc., Boise, ID (US)

(72) Inventors: Mustafa N. Kaynak, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/729,775

(22) Filed: Apr. 26, 2022

(65) Prior Publication Data

US 2022/0255561 A1    Aug. 11, 2022

Related U.S. Application Data

(63) Continuation of application No. 17/066,384, filed on Oct. 8, 2020, now Pat. No. 11,349,498.

(51) Int. Cl.
*H03M 13/00* (2006.01)
*H03M 13/11* (2006.01)
*H03M 13/29* (2006.01)
*H03M 13/15* (2006.01)

(52) U.S. Cl.
CPC .... *H03M 13/1108* (2013.01); *H03M 13/1177* (2013.01); *H03M 13/1575* (2013.01); *H03M 13/2948* (2013.01)

(58) Field of Classification Search
CPC ......... H03M 13/1108; H03M 13/1177; H03M 13/1575; H03M 13/2948
See application file for complete search history.

(56) References Cited

U.S. PATENT DOCUMENTS

| | | | |
|---|---|---|---|
| 7,203,890 B1 | 4/2007 | Normoyle | |
| 7,257,763 B1 | 8/2007 | Srinivasan et al. | |
| 10,523,236 B2 * | 12/2019 | Kuo | H03M 13/1128 |
| 10,707,899 B2 * | 7/2020 | Bhatia | G11C 29/42 |
| 10,715,182 B2 * | 7/2020 | Chen | H03M 13/1108 |
| 10,761,927 B2 * | 9/2020 | Lu | H03M 13/05 |
| 10,797,728 B1 * | 10/2020 | Varnica | H03M 13/3707 |
| 11,108,407 B1 * | 8/2021 | Lu | H03M 13/1111 |

(Continued)

*Primary Examiner* — Esaw T Abraham
(74) *Attorney, Agent, or Firm* — Greenberg Traurig

(57) ABSTRACT

A memory device having a Low-Density Parity-Check (LDPC) decoder that is energy efficient and has a low error floor. The decoder is configured to determine syndromes of bits in a codeword, select bits in the codeword based at least in part on the syndromes according to a first mode, and flip the selected bits in the codeword. The decoder can repeat the bit selection and flipping operations to iteratively improve the codeword and reduce parity violations. Further, the decoder can detect a pattern in parity violations of the codeword in its iterative bit flipping operations. In response, the decoder can change from the first mode to a second mode in bit selection for flipping. For example, the decoder can transmit from a dynamic syndrome mode to a static syndrome mode in response to the pattern of repeating a cycle of bit flipping iterations.

20 Claims, 7 Drawing Sheets

(56) References Cited

U.S. PATENT DOCUMENTS

| | | |
|---|---|---|
| 11,108,408 B2 * | 8/2021 | Kuo .................. H03M 13/2948 |
| 11,152,954 B2 * | 10/2021 | Hsiao .................. G06F 11/1068 |
| 11,349,498 B2 | 5/2022 | Kaynak et al. |
| 2007/0143659 A1 | 6/2007 | Ball |
| 2013/0031440 A1 | 1/2013 | Sharon et al. |
| 2013/0311857 A1 | 11/2013 | Murakami |
| 2014/0168811 A1 | 6/2014 | Yang et al. |
| 2015/0288386 A1 | 10/2015 | Murakami |
| 2017/0185476 A1 | 6/2017 | Wu et al. |
| 2022/0116056 A1 | 4/2022 | Kaynak et al. |

* cited by examiner

BIT FLIPPING LOW-DENSITY PARITY-CHECK DECODERS WITH LOW ERROR FLOOR

RELATED APPLICATIONS

The present application is a continuation application of U.S. patent application Ser. No. 17/066,384 filed Oct. 8, 2020 and issued as U.S. Pat. No. 11,349,498 on May 31, 2022, the entire disclosures of which application are hereby incorporated herein by reference.

TECHNICAL FIELD

At least some embodiments disclosed herein relate to error correction code (ECC) techniques in general, and more particularly, but not limited to decoders with Low-Density Parity-Check (LDPC) in memory systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
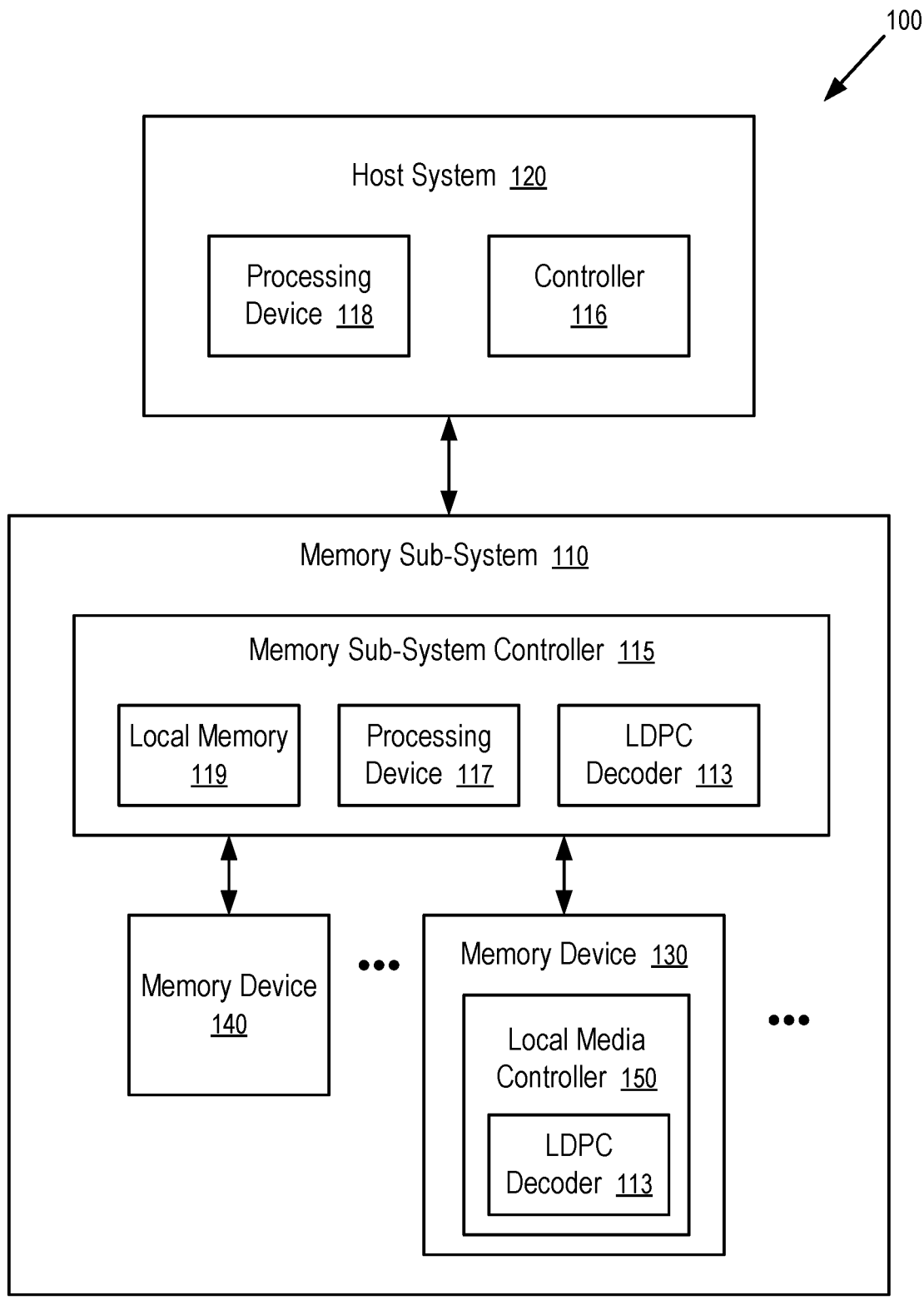
FIG. 1 illustrates an example computing system having a memory sub-system in accordance with some embodiments of the present disclosure.

At least some aspects of the present disclosure are directed to a memory sub-system configured with a Low-Density Parity-Check (LDPC) decoder that has improved decoding capability. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery (e.g., error correction). When data encoded with redundant information is stored in a memory sub-system, the memory sub-system can detect errors in data retrieved directly from the memory cells in the memory sub-system and/or recover the original data that is used to generate the data for storing in the memory cells. The recovery operation can be successful (or have a high probability of success) when the data retrieved directly from the memory cells in the memory sub-system contains fewer errors, or the bit error rate in the retrieved data is low. For example, error detection and data recovery can be performed using techniques such as Error Correction Code (ECC), Low-Density Parity-Check (LDPC) code, etc.

Bit Flipping (BF) decoders are energy efficient in comparison with other types of decoders, such as MinSum decoders. Since a bit flipping decoder consumes less energy in decoding data, a bit flipping decoder is advantageous in energy conscious applications, such as in mobile computing devices and/or battery-operated computing devices.

However, conventional bit flipping decoders have high error floors. For a given error rate in the bits of input data, the codeword error rate of a bit flipping decoder is relatively high even though the error rate in the bits of input data is relatively low. Thus, the bit flipping decoder has a relatively high probability of failing to decode input data that may be otherwise decoded successfully using alternative techniques.

At least some aspects of the present disclosure address the above and other deficiencies by implementing a stall detector to determine whether the error recovery progress of a bit flipping decoder in iteratively decoding the input data is stalled and, if so, changing its mode of bit selection operation to improve the decoding iterations.

In general, a bit flipping decoder operates by iteratively flipping selected bits that are determined to be likely in error to find a correct codeword that does not violate parity constraints. The bit flipping operations can be controlled by an energy function that is used to compute the energy levels of individual bits of a codeword and thus the energy level of the codeword. An energy level of a bit is an indication of the likelihood of the bit having an incorrect value. The energy level of a bit can be determined based at least in part on the syndrome of the bit. The syndrome of a bit of a codeword corresponds to, and can be represented by, the number of parity violations involving the bit. The bit flipping decoder makes iterative operations to selectively flip bits (e.g., changing/flipping the value of the bit) to find the corrected codeword through the optimization of the energy level of the codeword. For example, the energy function can be constructed such that the energy level of the codeword reaches a maximum (or minimum) when bit flipping corrects the codeword to arrive at the original error-free codeword that has no parity violation and the number of bits being corrected is the smallest and thus no miss-correction.

For example, the energy function can be configured to increase an energy level of a bit when the syndrome of the bit decreases and to decrease its energy level when its value is flipped from its original state. For example, the energy level of the codeword can be the sum of the energy level of the bits in the codeword. Thus, maximizing the energy level of the codeword can drive the flipping of less bits and reduced parity violation. Alternatively, the energy function can be configured or formulated to use the minimization of the energy level of the codeword to search for the corrected codeword that has no parity violation.

The energy level optimization corresponds to the search for the maximum point, or the minimum point, of the energy level of the codeword according to the energy function. The iterative operations to optimize the energy level of the codeword can be trapped at a local maximum/minimum point in the energy distribution. When trapped at a local maximum/minimum point, the bit flipping decoder enters a loop of bit flipping sequence that fails to further improve the codeword and its energy level through iteratively bit selection and flipping.

A stall detector can be used to detect the presence of such a loop. When the iterative operations of the bit flipping decoder are found to be repeating a pattern of bit flipping, the decoder can change certain aspects of its bit selection operations to move away from the local maximum/minimum point and thus increase the chances to reach a global maximum/minimum point for successful decoding.

For example, the decoder can switch between a static syndrome mode and a dynamic syndrome mode in response to the detection of the iterative operations being trapped in a loop.

In a static syndrome mode, a set of bits are selected for flipping based on their current syndromes. The selected bits are flipped together; and the impact of the bit flipping on the selection of the set of bits on syndromes are not considered before the flipping of the entire set of selected bits. For example, the impact of the bit flipping on a subset of the selected bits on the selection of the remaining subset of the selected bits are not considered. After the set of bits are flipped, the syndromes of codeword bits are updated for the selection of the next set of bits for flipping.

In a dynamic syndrome mode, the selecting of a bit for flipping causes the consideration of the impact of the flipping of the bit on the syndromes of other bits. Thus, the selection of the next bit for flipping is based on the updated syndromes of the remaining bits in view of the flipped value of the already selected bit. For example, the bits can be flipped one at a time; and the impact of the bit flipping on a first selected bit on the selection of the next bit is considered.

For example, the decoder can be configured to initially operate in the dynamic syndrome mode. When the optimization/error recovery progress is stalled in the dynamic syndrome mode, the decoder can switch to the static syndrome mode to escape the trap of the local maximum/minimum point in the energy function. For example, the decoder can continue in the static syndrome mode for a predetermined number of iterations, or until the progress is stalled again; and then the decoder can switch back to the dynamic syndrome mode. Escaping a trap or loop encountered in a particular mode (e.g., dynamic syndrome mode or static syndrome mode) provides an improved chance for a successful decoding and thus a lower error floor for the decoder.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a Low-Density Parity-Check (LDPC) decoder 113 configured to switch operation mode in selecting bits for flipping when error recovery progress is stalled. In some embodiments, the controller 115 and/or the controller 150 in the memory sub-system 110 can include at least a portion of the LDPC decoder 113. In other embodiments, or in combination, the controller 116 and/or the processing device 118 in the host system 120 can include at least a portion of the LDPC decoder 113. For example, the controller 115, the controller 116, and/or the processing device 118 can include logic circuitry implementing the LDPC decoder 113. For example, the controller 115, or the processing device 118 (e.g., processor) of the host system 120, can be configured to execute instructions stored in memory for performing the operations of the LDPC decoder 113 described herein. In some embodiments, the LDPC decoder 113 is implemented in an integrated circuit chip disposed in the memory sub-system 110. In other embodiments, the LDPC decoder 113 can be part of firmware of the memory sub-system 110, an operating system of the host system 120, a device driver, or an application, or any combination therein.

For example, the LDPC decoder 113 can initially decode a codeword using a first strategy to select bits for flipping. During the iterative operations of selecting bits for flipping to improve the energy level of the codeword, the LDPC decoder 113 can monitor the progress in improvements. When the iterative operations enter a loop of bit flipping pattern, the LDPC decoder 113 stalls. In response, the LDPC decoder 113 uses a second strategy to select bits for flipping. For example, when the first strategy is used, the LDPC decoder operates like a dynamic syndrome bit flipping decoder; and when the second strategy is used, the LDPC decoder operates like a static syndrome bit flipping decoder. Thus, the LDPC decoder can switch between functioning like a dynamic syndrome bit flipping decoder and functioning like a static syndrome bit flipping decoder in response to stalling.

Figure 2:
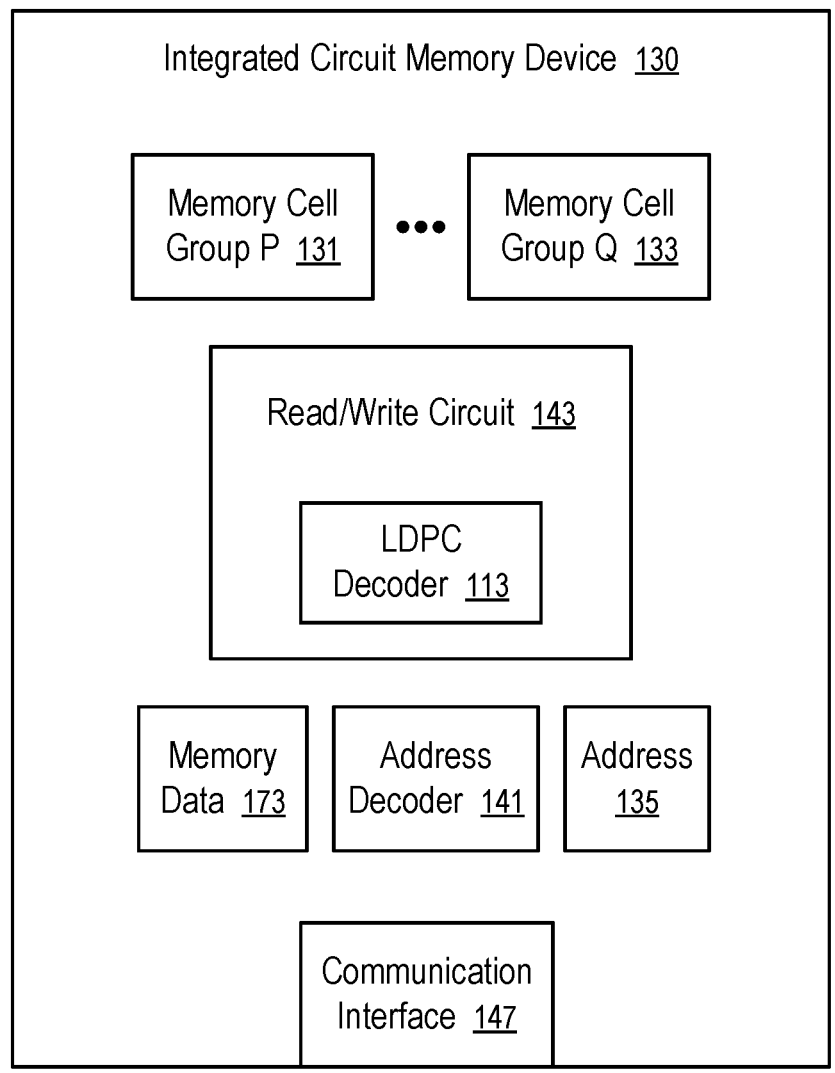
FIG. 2 illustrates an integrated circuit memory device having a Low-Density Parity-Check (LDPC) decoder according to one embodiment.

FIG. 2 illustrates an integrated circuit memory device 130 having a Low-Density Parity-Check (LDPC) decoder 113 according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, or group 133, can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve memory data 173 from memory cells identified by the memory address 135, and provide at least the memory data 173 as part of a response to the command. Optionally, the memory device 130 may decode the memory data 173 using the LDPC decoder 113 and provide the decoded data as part of a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the memory data 173 stored in the memory cells at the address 135.

In at some embodiments, the LDPC decoder 113 is a bit flipping decoder that can dynamically change its bit selection operations to reduce error floor. For example, when the iterative operations of selecting bits for flipping stall and fail to further improve the codeword, the LDPC decoder 113 changes its operations of selecting bits for flipping. The change provides an opportunity to escape the trap of a local maximum/minimum in optimizing an energy level of the codeword. Thus, the LDPC decoder 113 can have a reduced error floor lower than a traditional bit flipping decoder that does not change its bit selection operations/strategy.

Figure 3:
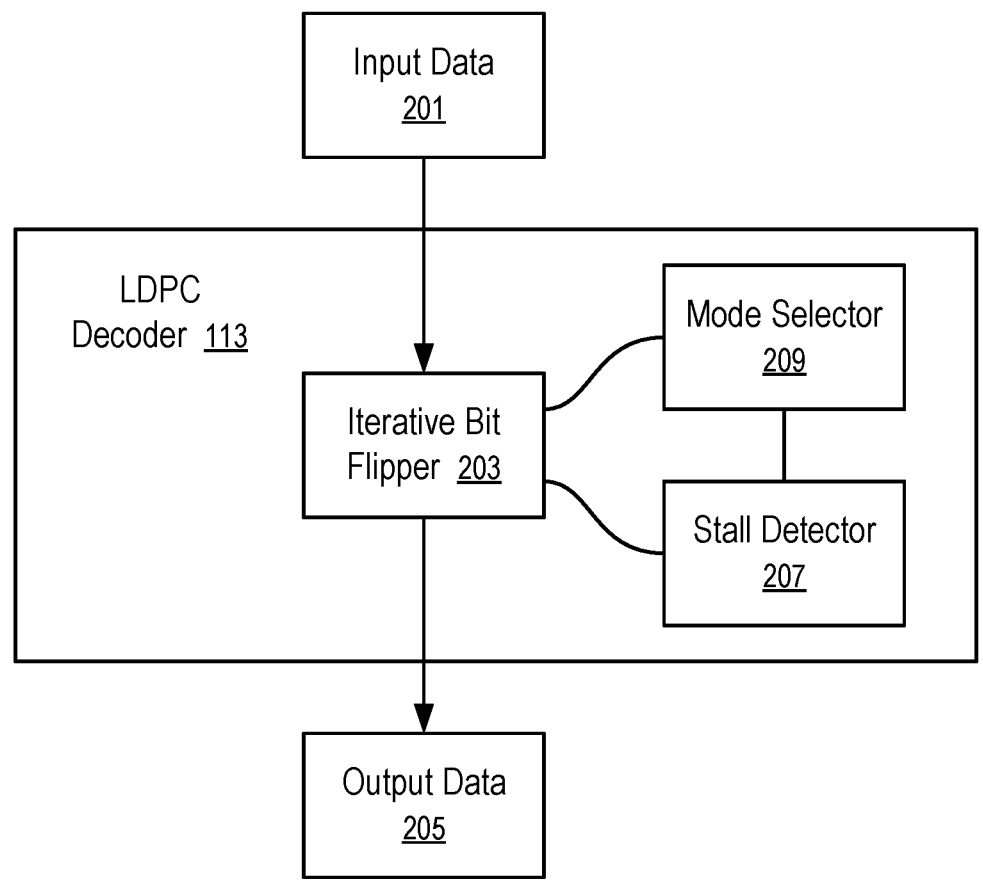
FIG. 3 illustrates the use of a stall detector to control the operation mode of a Low-Density Parity-Check (LDPC) decoder according to one embodiment.

FIG. 3 illustrates the use of a stall detector 207 to control the operation mode of a Low-Density Parity-Check (LDPC) decoder 113 according to one embodiment. For example, the LDPC decoder 113 of FIG. 3 can be used in the memory device 130 of FIG. 2 and/or the computing system 100 of FIG. 1.

In FIG. 3, the LDPC decoder 113 receives input data 201 encoded via a technique of Low-Density Parity-Check (LDPC) to generate output data 205 represented by the input data 201.

For example, the input data 201 can be the memory data retrieved from a memory cell group (e.g., 131 or 133). The input data 201 contains redundant information and may have errors. The output data 205 represents the original data that is encoded via Low-Density Parity-Check (LDPC) for storing in the memory cell group (e.g., 131 or 133).

The input data 201 is typically organized in codewords. A codeword has a predetermined number of bits. When a data item is encoded via Low-Density Parity-Check (LDPC) as a codeword, the codeword meets a number of parity constraints. Each parity constraint is applied to a particular subset of the bits in the codeword. A bit in the codeword can be in multiple subsets for multiple parity constraints. After the codeword is stored into memory cells of the memory device 130 and then read from the memory cells, the retrieved the codeword may have changes from the original codeword and thus errors in some of the bits. Flipping a bit in error corrects the bit; and flipping a bit that is not in error introduces a new error. A bit flipping decoder iteratively selects bits for flipping to minimize/maximize an energy level of the codeword as a way to search for a corrected version of the codeword that does not violate any parity constraints with a minimum number of bit corrections. The corrected version of the codeword can be considered as the original codeword. The original codeword can be mapped back to the data item that is encoded as the original codeword. The recovered data item can be provided as part of the output data 205.

The LDPC decoder 113 is a bit flipping decoder and is not limited to the use of a particular type of energy functions. The LDPC decoder 113 has an iterative bit flipper 203 that is configured to select a subset of bits for flipping to improve the energy level of a codeword, and the re-evaluate codeword having the flipped bits to select the next subset of bits for flipping. The iterative process generally can improve the energy level of the codeword and can lead to the original codeword that has no parity violations and potentially error free except for mis-correction case where the output of the decoder is another codeword different than the original codeword. There are ways like cyclic redundancy check (CRC) to detect these kind of errors.

The iterative bit flipper 203 has multiple operation modes, such as a static syndrome mode and a dynamic syndrome mode. In a dynamic syndrome mode, the selection of a bit for flipping leads to the update of the parity violations of other bits, which can affect the selection of the next bit for flipping. In a static syndrome mode, the selection of a bit for flipping does not change the count of parity violations of other bits for the selection of the next bit for flipping until the next iteration of selecting the next subsets for flipping. The different operation modes can be configured to optimize the energy level of the codeword according to a same energy function.

The iterative bit flipper 203 operates in one mode until a stall detector 207 determines that the progress of the improving the energy level of codeword is stalled. For example, when the optimization of the energy level of the codeword is trapped near a local maximum/minimum, the iterative bit flipper 203 can enter a pattern/loop of repeating the flipping of subsets of bits.

When the stall detector 207 determines that the progress of improving the energy level of codeword is stalled in the iterative bit flipper 203, the stall detector 207 causes a mode selector 209 of the LDPC decoder 113 to change the operation mode of the iterative bit flipper 203. The change in the operation mode provides an opportunity for the iterative flipping operations to escape the trap of a local maximum/minimum and thus reduce the error floor in comparison with a decoder configured with a single operation mode.

Figure 4:
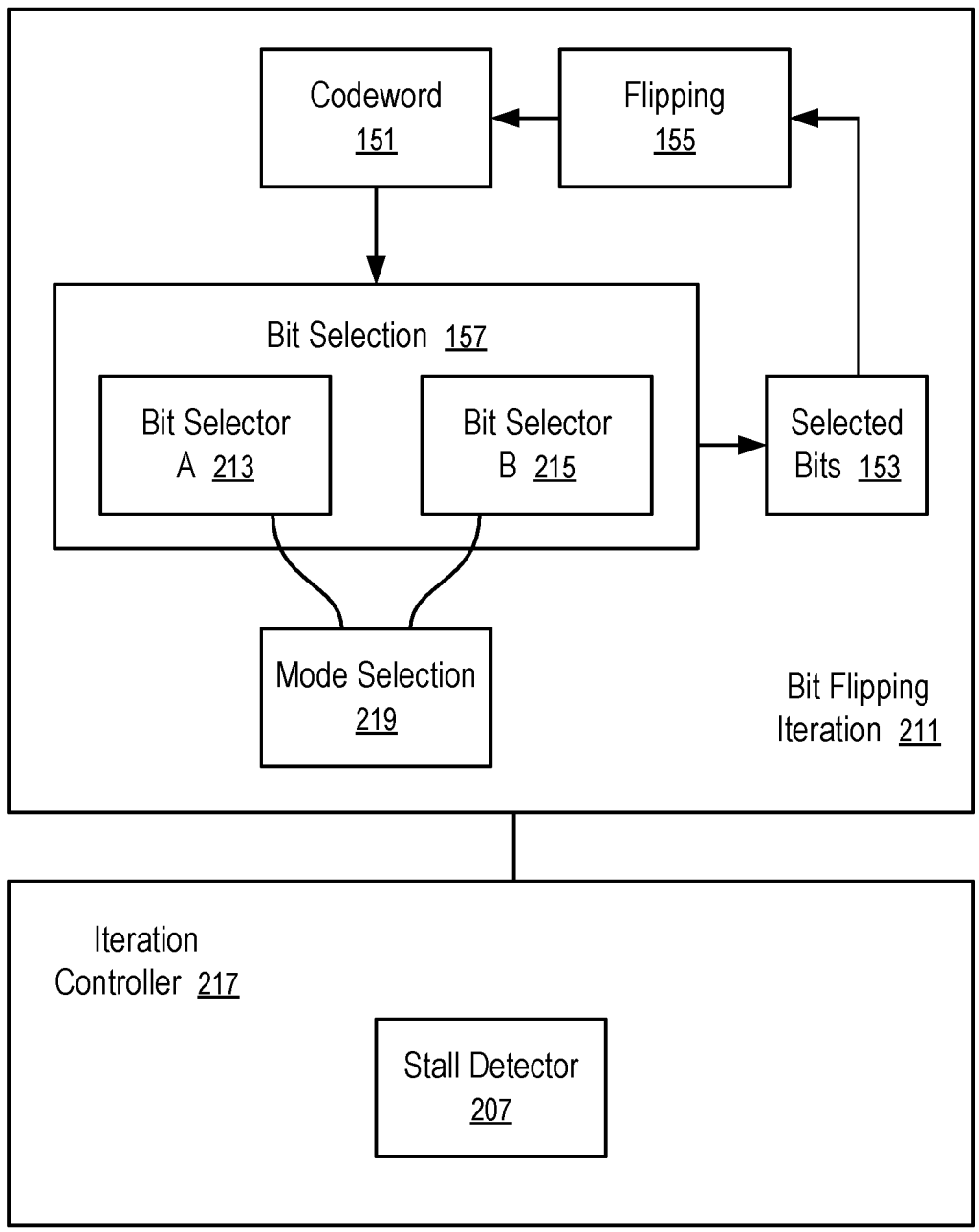
FIG. 4 illustrates the use of different bit selectors in a bit flipping Low-Density Parity-Check (LDPC) decoder according to one embodiment.

FIG. 4 illustrates the use of different bit selectors in a bit flipping Low-Density Parity-Check (LDPC) decoder according to one embodiment. For example, the technique of FIG. 4 can be used in the LDPC decoder 113 of FIGS. 1, 2, and/or 3.

In FIG. 4, a codeword that has parity violations is corrected through iterative operations. In a bit flipping iteration 211, the codeword 151 is provided as an input to bit selection 157 to identify selected bits 153 to improve/optimize an energy level of the codeword 151. Minimizing (or maximizing) the energy level reduces parity violations with minimum changes to the codeword 151 provided in the input data 201.

The bit selection 157 can be implemented using multiple bit selectors, such as a bit selector A 213 and a bit selector B 215. In general, two or more bit selectors can be implemented.

The bit selectors (e.g., 213 and 215) can be configured to optimize the energy level of the codeword according to the same energy function but with different strategies/modes in selecting bits for flipping and thus different strategies/modes in searching ways to maximize or minimize the energy level of the codeword according to the energy function. The output of the bit selection 157 is based on the setting of a mode selection 219.

For example, when the mode selection 219 in a first state, the bit selector A 213 is used to identify the selected bits 153; and when the mode selection 219 is in a second state, the bit selector B 215 is used to identify the selected bits 153.

Flipping 155 is performed for the selected bits 153 to correct the codeword 151 for the next iteration of bit selection 157 and flipping 155. For example, a bit having a value of 1 is flipped to have a value of 0; and a bit having a value of 0 is flipped to have a value of 1.

An iteration controller 217 monitors the progress of the bit flipping iteration 211. The iteration controller 217 includes a stall detector 207 that can detect if the progress of the bit flipping iteration 211 is stalled.

For example, for each bit flipping iteration 211, the iteration controller 217 can observe the total number of parity violations in the codeword 151 at the beginning of the iteration and/or at the end of the iteration. When the stall detector 207 detects a repeat of a cycle of changes in total number of parity violations in the codeword 151, the stall detector 207 can adjust the mode selection 219.

Figure 5:
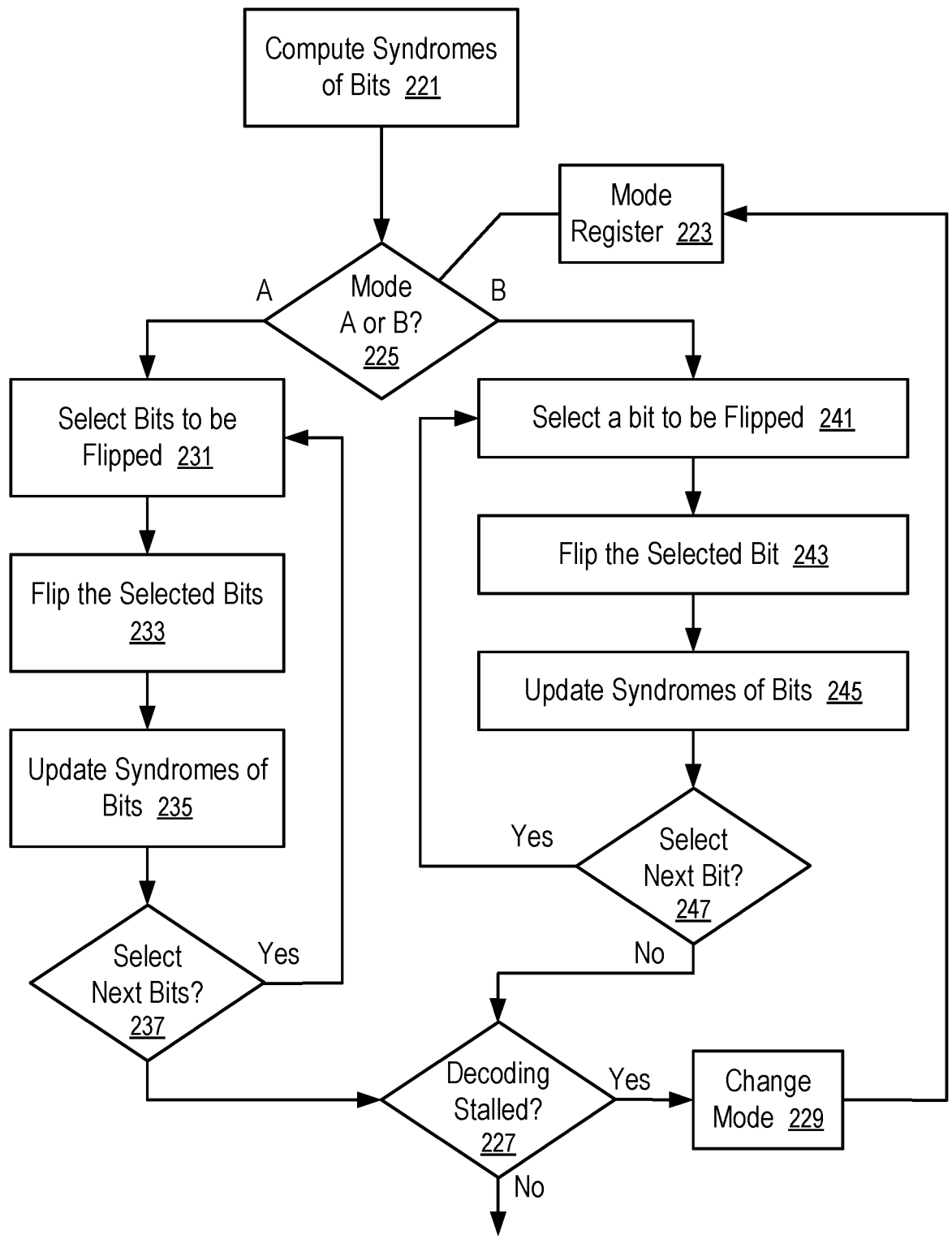
FIG. 5 shows the operations of a bit flipping Low-Density Parity-Check (LDPC) decoder according to one embodiment.

FIG. 5 shows the operations of a bit flipping Low-Density Parity-Check (LDPC) decoder according to one embodiment. For example, the operations of FIG. 5 can be implemented in a LDPC decoder 113 in FIGS. 1, 2, and/or 3. For example, the operations of FIG. 5 can be performed using the bit selectors of FIG. 4.

In FIG. 5, at block 221, the LDPC decoder 113 computes syndromes of bits of a codeword 151. The syndrome of a bit in the codeword 151 is representative of the number of parity violations that involve the value of the bit.

A mode register 223 stores a value that controls a mode of bit selection 157.

For example, if, at block 225, the mode register 223 indicates the use of mode A, a bit selector A 213 is used to perform bit selection 157. If the mode register 223 indicates the use of mode B, a bit selector B 215 is used to perform bit selection 157.

If mode A is selected by the mode register 223, at block 231 the LDPC decoder 113 selects multiple bits to be flipped. After the selection of the selected bits 153 at block 231, the LDPC decoder 113 flips the selected bits 153 at block 233 and update syndromes of bits of the codeword 151 at block 235. Thus, the selection of one bit in the selected bits 153 does not affect the syndromes of other bits for their selection as part of the selected bits 153 for flipping in the bit flipping iteration 211.

At block 237, the LDPC decoder 113 decides whether to select the next bits for another bit flipping iteration 211 of the operations in blocks 231 to 235.

If mode B is selected by the mode register 223, at block 241 the LDPC decoder 113 selects a bit to be flipped. Before selecting the next bit for flipping, the LDPC decoder flips the selected bit at block 243 and updates, at block 245, syndromes of bits that are affected by the flipping of the selected bit. Thus, if the LDPC decoder 113 decides at block 247 to select a next bit for flipping, the next bit is selected based on the updated syndromes of bits in the codeword 151, in view of the flipping of the selected bit at the block 243. Thus, in blocks 241 to 245, updated syndromes are used to select one bit for flipping before the syndromes are updated again for bit selection. In contrast, in blocks 231 to 235, updated syndromes are used to select more than one bit for flipping before the syndromes are updated again for bit selection. In general, different modes of bit selection can be based on different numbers of bits that can be selected for flipping before the syndromes are updated again for bit selection.

At block 227, a stall detector 207 of the LDPC decoder 113 determines if the progress of improving the codeword 151 in the bit flipping iterations 211 is stalled. If so, the LDPC decoder 113 changes its operation mode at block 229 by updating the mode register 223.

Figure 6:
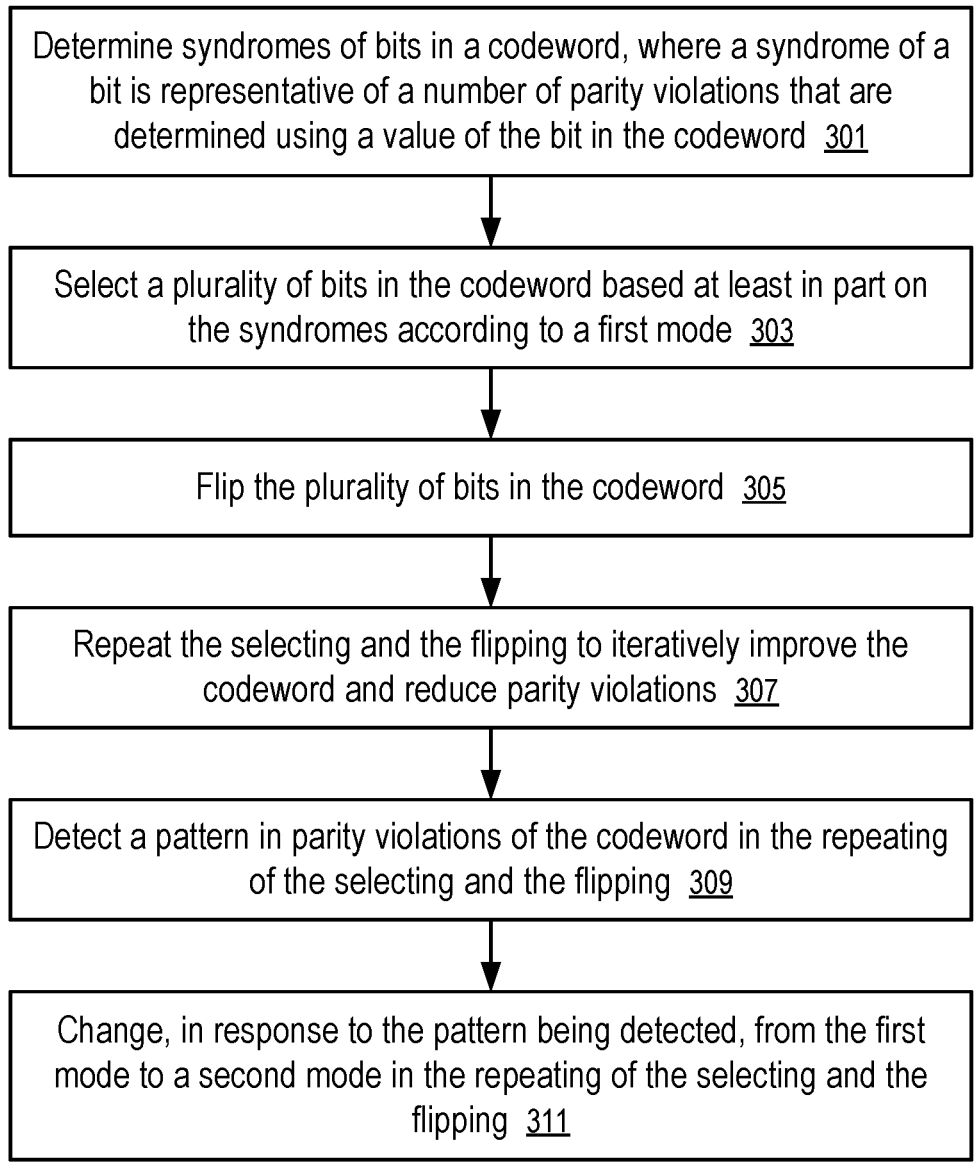
FIG. 6 shows a method of a bit flipping decoder according to one embodiment.

FIG. 6 shows a method of a bit flipping decoder according to one embodiment. The method of FIG. 6 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 6 is performed at least in part by the controller 115 and/or the controller 150 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 6 can be implemented in the LDPC decoder 113 of FIGS. 1, 2, and/or 3, using the techniques of FIGS. 4 and/or 5.

At block 301, the LDPC decoder 113 determines syndromes of bits in a codeword 151. In general, a syndrome of a bit is representative of a number of parity violations that are determined using a value of the bit in the codeword.

At block 303, the LDPC decoder 113 selects a plurality of bits in the codeword 151 based at least in part on the syndromes according to a first mode.

At block 305, the LDPC decoder 113 flips the plurality of selected bits 153 in the codeword 151.

At block 307, the LDPC decoder 113 repeats the selecting and the flipping as performed in blocks 303 and 305 to iteratively improve the codeword 151 and reduce parity violations.

At block 309, the LDPC decoder 113 detects a pattern in parity violations of the codeword 151 in the repeating of the bit selection 157 and the flipping 155 of the respective selected bits 153.

At block 311, the LDPC decoder 113 changes, in response to the pattern being detected, from the first mode to a second mode in the repeating of the bit selection 157 and the flipping 155 of the respective selected bits 153.

For example, the first mode and the second mode can include a static syndrome mode and a dynamic syndrome mode. In the static syndrome mode, the selected bits 153 for flipping are selected based on the syndromes of the bits in the codeword 151 calculated prior to the selection 157 of the selected bits 153 for flipping. In contrast, in the dynamic syndrome mode, a second portion of the selected bits 153 are selected for flipping based on syndromes updated according to flipped values of a first portion of the selected bits 153. After the first point is selected for flipping, the syndromes of the bits in the codewords 151 are updated for the selection of the section portion of the selected bits 153.

For example, the LDPC decoder 113 can repeat the bit selection 157 and the bit flipping 155 to maximize (or minimize) an energy level of the codeword 151. Both the first mode and the second more can be configured to maximize (or minimize) the energy level of the codeword 151 according to a same energy function. The energy function is configured to identify an energy level of the codeword 151 based on the syndromes of the bits of the codewords, and the bits that have been corrected through flipping to reduce parity violations. The energy function is configured such that maximizing (or minimizing) the energy level of the codeword 151 corresponds to reducing parity violations with less bits that need to be corrected through flipping.

For example, the first mode is the dynamic syndrome mode; and the second mode can be the static syndrome mode. In response to the pattern that is indicative of stalling, the LDPC decoder 113 changes the mode to avoid the trap of a local maximum (or minimum) for the energy level of the codeword 151.

For example, the pattern can be detected by determining a repetition of a sequence of numbers, where each of the numbers corresponds to a total number of parity violations in the codeword 151 in a bit flipping iteration 211.

After the LDPC decoder 113 determines a corrected codeword 151 through bit flipping iterations 211, the LDPC decoder 113 can determine a data item represented by the corrected codeword 151. Compared to the original codeword 151, the corrected codeword 151 has one or more bits that have been flipped from the original codeword 151 so that the corrected codeword 151 has no parity violations, in view of a plurality of predefined parity constraints. Each of the predefined parity constraints requires a subset of bits of the corrected codeword 151 to meet a predefined parity relation. The energy function and bit flipping iterations 211 are configured to maximize (or minimize) the energy level of the codeword 151 such that the process of maximizing (or minimizing) the energy level of the codeword 151 drives the search for reduced parity violations with less bit corrections and thus avoid miss-corrections.

For example, after the memory device 130 reads a group of memory cells to obtain memory data 173, the LDPC decoder 113 can determine an error free codeword from a codeword 151 in the memory data 173 through the bit flipping iterations 211 and then determine the data item corresponding to the error free codeword. The memory device 130 can provide the data item as part of the response to a read command.

Figure 7:
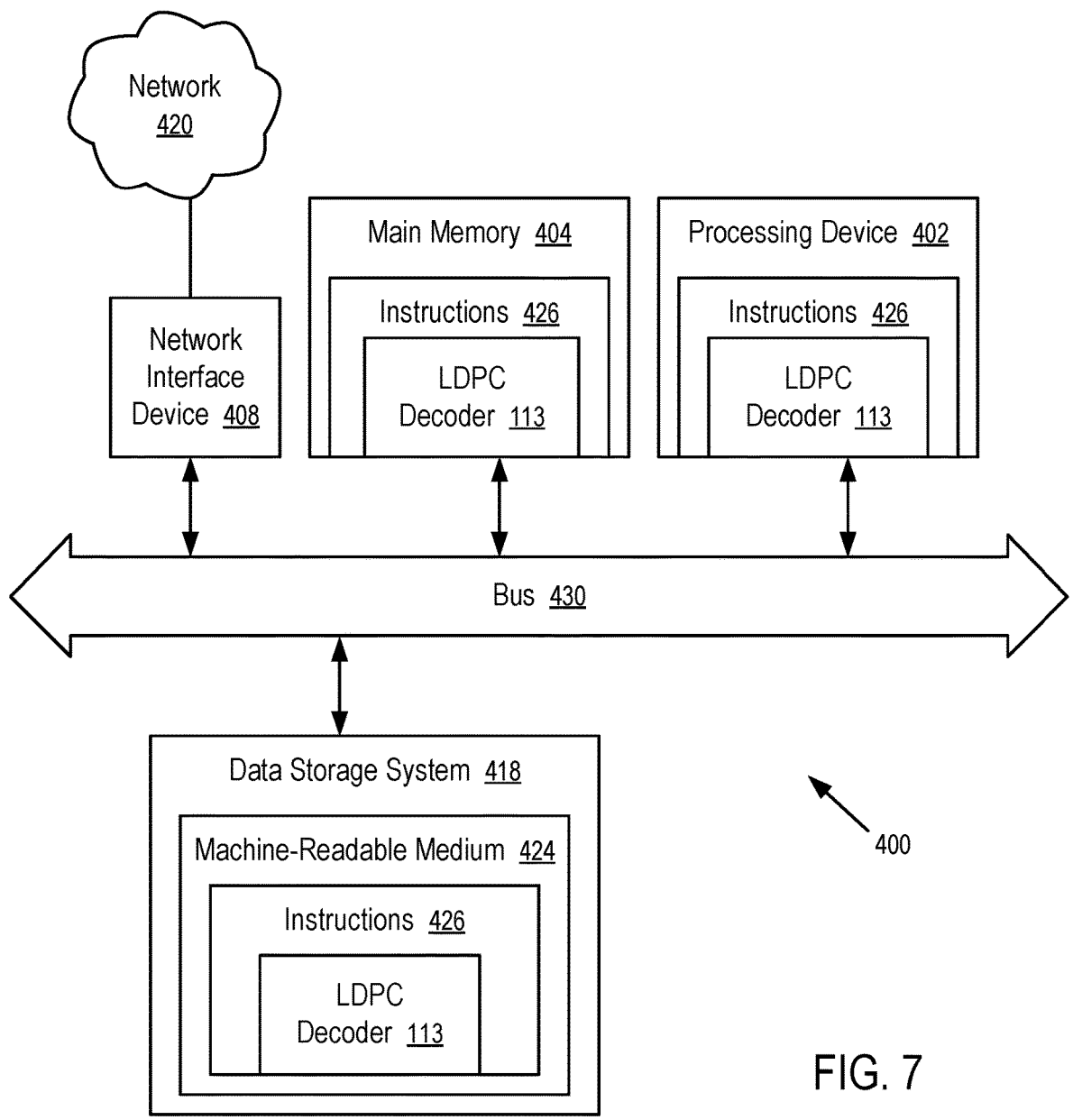
FIG. 7 is a block diagram of an example computer system in which embodiments of the present disclosure can operate.

FIG. 7 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a LDPC decoder 113 (e.g., to execute instructions to perform operations corresponding to the LDPC decoder 113 described with reference to FIGS. 1-6). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a LDPC decoder 113 (e.g., the LDPC decoder 113 described with reference to FIGS. 1-6). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   memory cells; and
   a logic circuit configured to:
     obtain a codeword represented by states of the memory cells;
     perform bit flipping decoding of the codeword according to a first mode of selecting bits for flipping;
     detect a pattern in parity violations of the codeword in the bit flipping decoding according to the first mode; and
     change, in response to detection of the pattern, from the first mode of selecting bits for flipping to a second mode of selecting bits for flipping in the bit flipping decoding.

2. The device of claim 1, wherein the logic circuit is further configured to:
   determine syndromes of bits in the codeword, wherein each respective syndrome of a bit is representative of a number of parity violations that are determined using a value of the bit in the codeword, wherein selection of bits for flipping is based on the syndromes of bits.

3. The device of claim 2, wherein both the first mode and the second more are configured to maximize or minimize an energy level of the codeword according to a same energy function.

4. The device of claim 3, wherein the first mode is a static syndrome mode and the second mode is a dynamic syndrome mode; or wherein the second mode is the static syndrome mode and the first mode is the dynamic syndrome mode.

5. The device of claim 4, wherein the static syndrome mode is configured to select bits for flipping based on the syndromes of the bits calculated prior to selected bit being flipped; and the dynamic syndrome mode is configured to select a subsequent bit for flipping based on syndromes updated according to a prior bit being selected and flipped before the subsequent bit.

6. The device of claim 5, wherein the pattern is a repetition of a sequence of numbers, each of the numbers identifying a total number for parity violations in the codeword in an iteration of the repeating.

7. The device of claim 6, wherein the logic circuit is further configured to:
   determine a corrected codeword through repeating selection of bits for flipping and repeating changes between the first mode and the second mode; and
   determine a data item represented by the corrected codeword.

8. The device of claim 7, wherein the logic circuit is further configured to:
   read the memory cells to determine an initial codeword; and
   repeating selection of bits for flipping, and flipping selected bits, and changing between the first mode and the second mode in response to detection of the pattern to determine the corrected codeword.

9. The device of claim 1, further comprising:
   an integrated circuit package configured to enclose the memory cells and the logic circuit.

10. A method, comprising:
    obtaining a codeword represented by states of memory cells in a device;
    performing bit flipping decoding of the codeword according to a first mode of selecting bits for flipping;
    detecting a pattern in parity violations of the codeword in the bit flipping decoding according to the first mode; and
    change, in response to detection of the pattern, from the first mode of selecting bits for flipping to a second mode of selecting bits for flipping in the bit flipping decoding.

11. The method of claim 10, further comprising:
    determining syndromes of bits in the codeword, wherein each respective syndrome of a bit is representative of a number of parity violations that are determined using a value of the bit in the codeword, wherein selection of bits for flipping is based on the syndromes of bits.

12. The method of claim 11, wherein both the first mode and the second mode are configured to maximize or minimize an energy level of the codeword according to a same energy function.

13. The method of claim 12, wherein the first mode is a static syndrome mode and the second mode is a dynamic syndrome mode; or wherein the second mode is the static syndrome mode and the first mode is the dynamic syndrome mode.

14. The method of claim 13, wherein the static syndrome mode is configured to select bits for flipping based on the syndromes of the bits calculated prior to selected bit being flipped; and the dynamic syndrome mode is configured to select a subsequent bit for flipping based on syndromes updated according to a prior bit being selected and flipped before the subsequent bit.

15. The method of claim 14, wherein the pattern is a repetition of a sequence of numbers, each of the numbers identifying a total number for parity violations in the codeword in an iteration of the repeating.

16. The method of claim 15, further comprising:
   determine a corrected codeword through repeating selection of bits for flipping and repeating changes between the first mode and the second mode; and
   determine a data item represented by the corrected codeword.

17. The method of claim 16, further comprising:
   repeating selection of bits for flipping, and flipping selected bits, and changing between the first mode and the second mode in response to detection of the pattern to determine the corrected codeword.

18. A low-density parity-check decoder, comprising:
   a first circuit to receive a codeword for decoding;
   a second circuit configured to:
      determine syndromes of bits in the codeword, wherein each respective syndrome of each bit of the codeword specifies a number of parity violations of the codeword that involve the bit;
      repeat selection of bits in the codeword according to a first mode for flipping to improve the codeword until a predefined condition is detected;
      change from the first mode to a second mode; and
      repeat selection of bits in the codeword according to the second mode for flipping.

19. The low-density parity-check decoder of claim 18, wherein the predefined condition includes that improvement in maximizing or minimizing an energy level of the codeword according to a same energy function is stalled; wherein the second circuit is further configured to:
   detect the predefined condition during repeating selection of bits in the codeword according to the second mode for flipping and, in response, change from the second mode to the first mode.

20. The low-density parity-check decoder of claim 19, wherein the first mode is a static syndrome mode and the second mode is a dynamic syndrome mode.

* * * * *